United States Patent [19]

Tomita et al.

[11] Patent Number: 5,440,169
[45] Date of Patent: Aug. 8, 1995

[54] RESIN-PACKAGED SEMICONDUCTOR DEVICE WITH FLOW PREVENTION DIMPLES

[75] Inventors: Yoshihiro Tomita; Shunichi Abe, both of Itami, Japan

[73] Assignee: Mitsubishi Denki Kabushiki Kaisha, Tokyo, Japan

[21] Appl. No.: 177,380

[22] Filed: Jan. 5, 1994

[30] Foreign Application Priority Data

Jan. 8, 1993 [JP] Japan .................. 5-002092

[51] Int. Cl.⁶ .............. H01L 23/28; H01L 23/48
[52] U.S. Cl. .................. 257/667; 257/706; 257/717; 257/730; 257/796
[58] Field of Search ............ 257/730, 796, 706, 711, 257/717, 739, 667

[56] References Cited

U.S. PATENT DOCUMENTS

| 4,777,520 | 10/1988 | Nambu et al. | 257/730 |
| 4,984,059 | 1/1991 | Kubota et al. | 257/676 |
| 5,172,213 | 12/1992 | Zimmerman | 257/796 |
| 5,214,846 | 6/1993 | Asami et al. | 257/735 |
| 5,216,283 | 6/1993 | Lin | 257/796 |

FOREIGN PATENT DOCUMENTS

| 55-77160 | 6/1980 | Japan | 257/730 |
| 63-239967 | 10/1988 | Japan . | |
| 2-205351 | 8/1990 | Japan | 257/739 |
| 3194954 | 8/1991 | Japan . | |
| 3283453 | 12/1991 | Japan . | |
| 4003438 | 1/1992 | Japan . | |
| 4051549 | 2/1992 | Japan . | |
| 4246849 | 9/1992 | Japan . | |
| 5-152488 | 6/1993 | Japan | 257/667 |

*Primary Examiner*—Robert P. Limanek
*Attorney, Agent, or Firm*—Leydig, Voit & Mayer

[57] ABSTRACT

A resin-packaged semiconductor device having a semiconductor element mounted on a first surface of a mounting pad. The mounting pad has an edge molded in a frame-shaped portion of a molding material. A second surface of the mounting pad has a central portion that is not included in the edge of the mounting pad and that is not covered with the molding material, the central portion of the second surface being exposed at the outside of the device. The thickness of the molding material in the frame-shaped portion and on the second surface of the mounting pad can be readily reduced to reduce the thickness of the device. Since the molding material does not cover the entire second surface, molding characteristics as well as heat radiation characteristics are improved.

5 Claims, 5 Drawing Sheets

RESIN-PACKAGED SEMICONDUCTOR DEVICE WITH FLOW PREVENTION DIMPLES

BACKGROUND OF THE INVENTION

1. Field of the Invention

The present invention relates to a semiconductor device, and particularly to a semiconductor device in which a semicondnctor element is mounted on a mounting surface of a mounting section while a portion of the non-mounting surface of the mounting section is molded in a frame-shaped configuration with a molding material.

2. Description of the Related Art

FIG. 10 shows, in a side sectional view, an example of a conventional semiconductor device. Referring to the drawing, the device has a semiconductor element 1 adhered to and mounted on a surface (upper surface, as viewed in FIG. 10) of a mounting section 2 by an adhesive 3. Inner leads 5 are electrically connected with the semiconductor element 1 by wires 4. The semiconductor element 1, the mounting section 2, the adhesive 3, the wires 4, and the inner leads 5 are molded with a molding material 6 into a molded structure. Certain portions of lead members continuing from the inner leads 5 and extending outside of the molding material 6 constitute outer leads 7.

In the conventional semiconductor device having the above construction, the molded structure of the device has a total thickness D, the semiconductor element 1 has a thickness $d_1$, and the portion of the molding material 6 disposed below, or on the reverse side of the mounting section 2, has a thickness $d_2$. When the total thickness D of the molded structure is reduced to reduce the entire thickness of the semiconductor device, the thickness $d_2$ of the reverse portion of the molding-material 6 is reduced correspondingly. In a resin molding process, this portion of the molding material 6 may not thoroughly cover the reverse surface of the mounting section 2, and thus, the encapsulation characteristics of the molding material 6 may be impaired. Although the thickness $d_1$ of the semiconductor element 1 itself may be reduced, it is not easy to reduce this thickness $d_1$ without involving disadvantages such as decreased reliability of the semiconductor element 1.

It has been the recent demand from the market that semiconductor devices have high heat radiation characteristics. In order to obtain high heat radiation characteristics it is possible to adopt, for example, a construction in which the mounting section 2 is exposed to the outside of the device.

FIG. 11 shows, in a side sectional view, an example of a conventional semiconductor device constructed to have an exposed portion. As shown in FIG. 11, the entire reverse surface of the mounting section 2 is exposed. As a result, however, stress is concentrated on an edge 2A of the mounting section 2. This is disadvantageous in that the molding material 6 and the mounting section 2 may be separated at the interface therebetween, thereby adversely affectlng the reliability of the semiconductor device.

Thus, the conventional semiconductor devices have the following problems: the molding characteristics of a molding material are impaired at a portion of the material disposed on the reverse side of the mounting section; and a construction in which the mounting portion is partly exposed in order to obtain high heat radiation characteristics adversely affects the reliability of the semiconductor device.

SUMMARY OF THE INVENTION

An object of the present invention is to provide a semiconductor device having good molding characteristics and exhibiting high radiation characteristics and high heat reliability.

According to the present invention, there is provided a semiconductor device comprising: a semiconductor element; a mounting pad having a first surface on which the semiconductor element is mounted inner leads electrically connected to the semiconductor element; conduction means through which the semiconductor element and the inner leads are electrically connected with each other; a molding material in which the semiconductor element, the mounting pad the inner leads and the conduction means are encapsulated and outer leads electrically connected to the inner leads and extending the outside of the molding material, wherein the mounting pad has an edge molded in a frame-shaped configuration encapsulated by a portion of the molding material, and wherein a second surface of the mounting pad on which the semiconductor element is not mounted has a central portion not included in the edge of the mounting pad and that is not encapsulated in the molding material, the central portion of the second surface being exposed at the outside of the device.

DESCRIPTION OF THE PREFERRED EMBODIMENTS

Embodiments of the present invention will now be described with reference to the drawings.

First Embodiment

Figure 1:
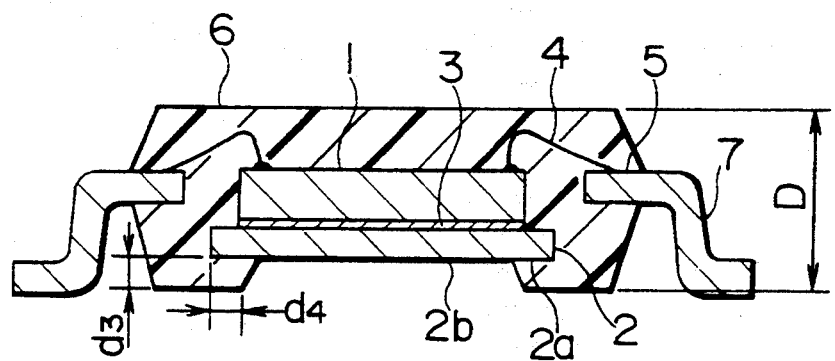
FIG. 1 is a side sectional view of a semiconductor device according a first embodiment of the present invention.
Figure 2:
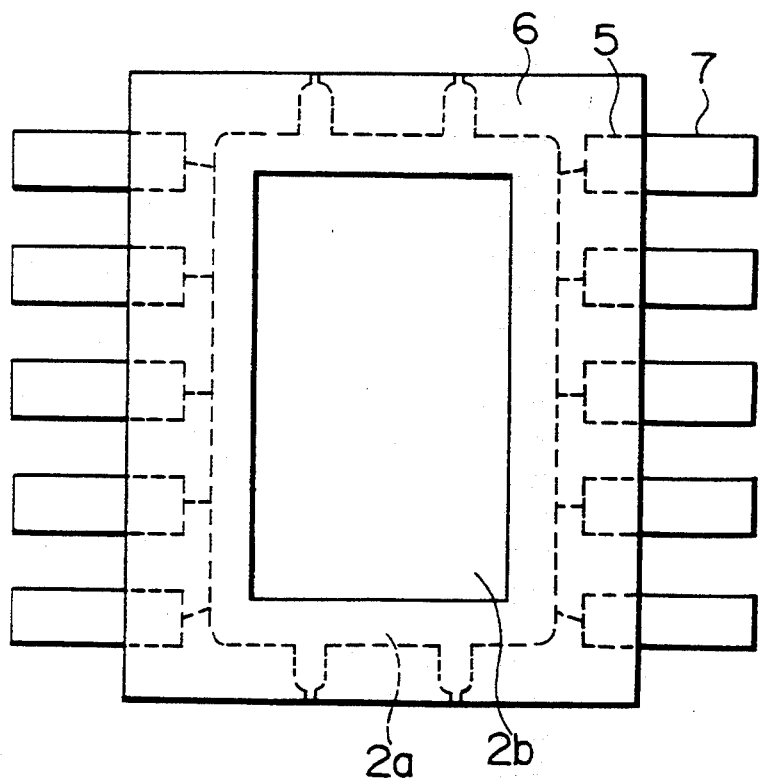
FIG. 2 is a plan view of the device shown in FIG. 1, taken from the reverse side of the device.

A semiconductor device according to a first embodiment of the present invention is shown in FIG. 1 and FIG. 2 in a side sectional view and a plan view taken from the reverse side of the device, respectively. In these and the other drawings, like reference numerals denote the same or corresponding components. Referring to FIGS. 1 and 2, the semiconductor device has a semiconductor element mounted on a first (upper, as viewed in FIG. 1) surface of a mounting pad 2. The mounting pad 2 has an edge 2a a frame-shaped configuration of which is encapsulated by a portion of a molding material 6. A second surface of the mounting pad 2 on which the semiconductor element 1 is not mounted has a central portion that is not included in the edge of the mounting pad 2 and that is not covered by the molding material 6. This central portion of the second surface of the mounting section 2 forms an exposed surface 2b which is exposed at the outside surface of the device.

In the semiconductor device having the above-described construction, even when the entire thickness of the semiconductor device is reduced, with the result that the total thickness D of the structure encapsulated with the molding material 6 is reduced to a relatively small value and the thickness $d_3$ of the portion of the molding material 6 on the second surface of the mounting pad 2 is reduced to a relatively very small value, the only portion that needs forming is a portion of the molding material 6 corresponding to a width $d_4$ at the edge 2a on the second surface of the mounting section 2. Therefore, during a resin molding process employing a mold, it is not necessary to charge a resin over the entire second surface of the mounting pad 2, and thus, resin molding is facilitated. Such resin molding employs a necessary width $d_4$ for achieving sufficient bond between the molding material 6 and the mounting section 2.

Figure 11:
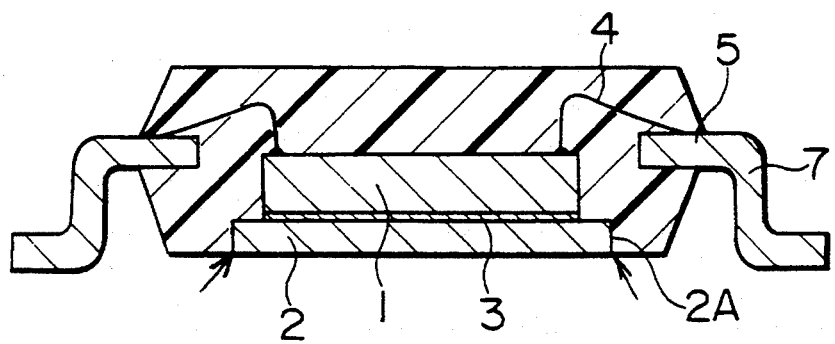
FIG. 11 is a side sectional view of another semiconductor device.

When the width $d_4$ of the edge portion 2a on the second surface is set at a small value, the area of the exposed surface 2b is increased, thereby increasing heat radiation. Since the edge 2a of the mounting section 2 is molded, it is possible to reduce the concentration of stress at the edge 2A occurring in the construction shown in FIG. 11.

Thus, it is possible to provide a semiconductor device which has good molding characteristics and high heat radiation characteristics, and which is capable of meeting requirements of certain characteristics from semiconductor devices, i.e., heat radiation and reliability.

Second Embodiment

Figure 3:
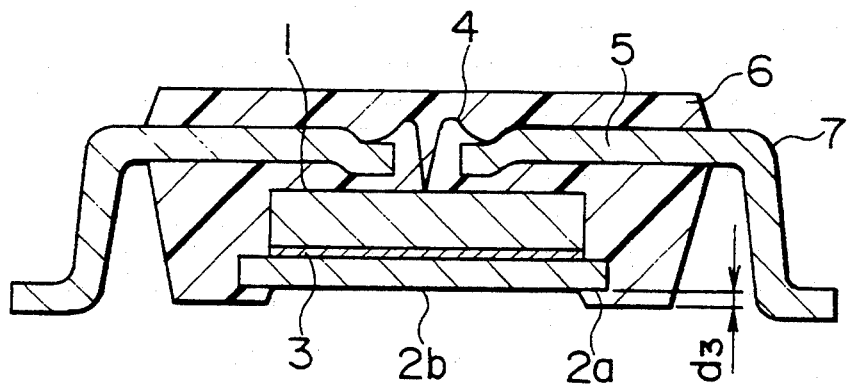
FIG. 3 is a side sectional view of a semiconductor device according to a second embodiment of the present invention.

A semiconductor device according to a second embodiment of the present invention is shown in a sectional side view in FIG. 3. The semiconductor device is of a so-called "lead-on-chip (LOC) type" in which inner leads 5 extending over the semiconductor element 1. When this type of semiconductor device is compared with the semiconductor device shown in FIG. 1, since the former has the inner leads 5 extending over the semiconductor element 1, the total thickness D of the molded structure is increased by the thickness of the inner leads 5 and the thickness of a portion of the molding material 6 disposed between the inner leads 5 and the semiconductor element 1. As a result, when the same total thickness D as that of the device shown in FIG. 1 is adopted, the molding material 6 in the device shown in FIG. 3 has an even smaller thickness $d_3$ than the comparable thickness in the device shown in FIG. 1. In the second embodiment, therefore, the advantage provided by the arrangement of the present invention in which the edge 2a of the mounting section 2 is encapsulated by a frame-shaped configuration of the molding material 6 is furthered, and forming characteristics are greatly improved.

Third Embodiment

Figure 4:
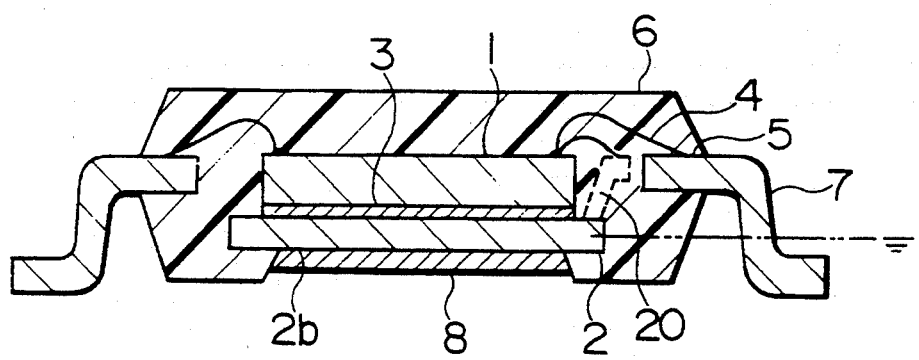
FIG. 4 is a side sectional view of a semiconductor device according to a third embodiment of the present invention.

A semiconductor device according to a third embodiment is shown in a sectional view in FIG. 4. The embodiment shown in FIG. 4 is distinguished in that an insulator 8 is provided on the exposed surface 2b on the second surface of the mounting pad 2. The insulator 8 may be formed on the exposed surface 2b by a technique such as potting, screening or dipping. This arrangement is effective, for example, when the mounting pad 2 is required to provide a ground potential by certain Characteristics of the semiconductor element 1, or when the semiconductor device must have a construction different from that shown in FIG. 1 in accordance with the conditions in which the device is to be used.

For instance, when a connecting portion 20 provided on the mounting pad 2 is electrically connected with the semiconductor element 1 by one or more of the wires 4 while the mounting pad 2 is grounded, the semiconductor element 1 may undergo electrical short-circuiting or leakage during actual use of the semiconductor device. The provision of the insulator 8 on the exposed surface 2b makes it possible to prevent the semiconductor element 1 from being electrically short-circuited when there is a risk that external wires or the like may contact the exposed surface 2b of the device.

The insulator 8 may be provided on the exposed surface 2b by a technique other than those mentioned above. Further, the insulator 8 may be provided either before or after molding the semiconductor element 1, etc. with the molding material 6.

Fourth Embodiment

Figure 5:
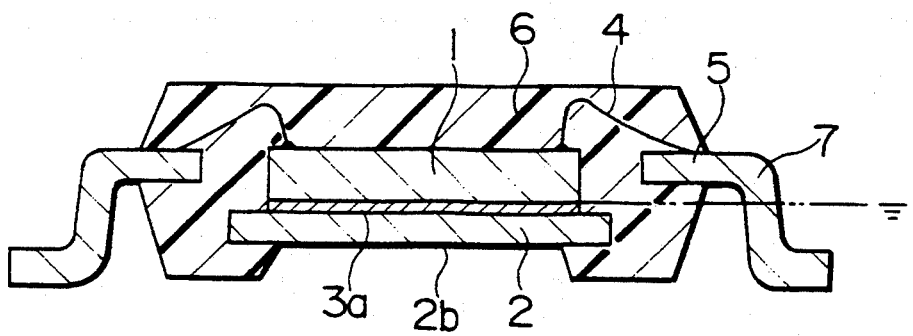
FIG. 5 is a side sectional view of a semiconductor device according to a fourth embodiment of the present invention.

A semiconductor device according to a fourth embodiment of the present invention is shown in a sectional view in FIG. 5. Referring to FIG. 5, this embodiment is distinguished in that the semiconductor element 1 is secured to the mounting pad 2 by an adhesive comprising an insulating resin 3a. This arrangement is effective when the reverse surface of the semiconductor element 1 is arranged to provide a ground potential (for example, when the reverse surface is metallized). That is, with the above construction, short-circuits due to contact with the exposed surface 2b or leakage can be prevented without requiring a separate process and merely by using the insulating resin 3a as the adhesive for securing the semiconductor element 1 to the mounting pad 2.

Fifth Embodiment

Figure 6:
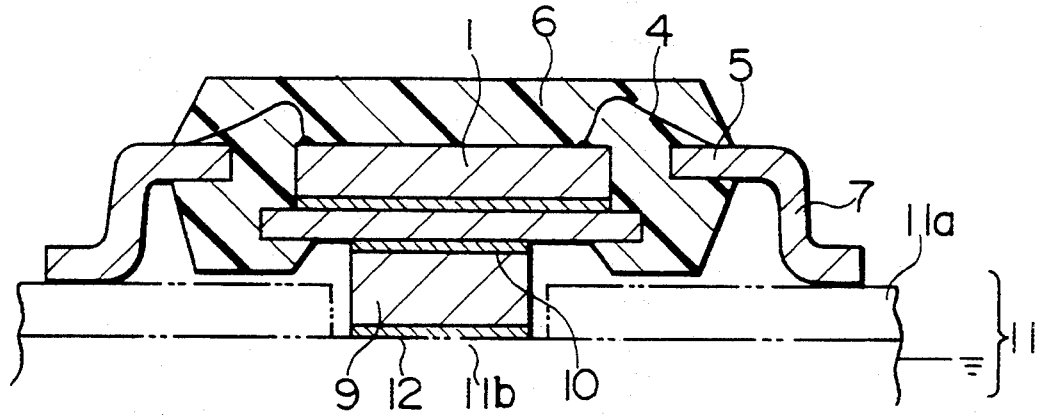
FIG. 6 is a side sectional view of a semiconductor device according to a fifth embodiment of the present invention.

A semiconductor device according to a fifth embodiment of the present invention is shown in a sectional view in FIG. 6. The embodiment shown in FIG. 6 is distinguished in that a connecting member 9 is provided on the exposed surface 2b of the mounting section 2 using an electrically conductive adhesive 10. The outer leads 7 of the semiconductor device are connected to wiring portions 11a of a printed circuit board 11 by a method such as the vapor phase surface mounting (VSP) method or an IR reflow method during a mounting process. In this process, the connecting member 9 is secured to a grounding portion 11b of the printed circuit board 11 by an electrically conductive adhesive 12, so that the semiconductor element 1 is able to obtain a ground potential directly from the printed circuit board 11. In this case, the adhesive 3 with which the semiconductor element 1 is secured to the mounting pad 2 is, of course, made of an electrically conductive material. The electrically conductive adhesive 12 comprises, for example, a low-melting-point solder. The connecting member 9 may be made of a material such as Cu or CuW. Although materials which may be used to form the connecting member 9 are not specifically limited, selecting a material, such as Cu, having high thermal conductivity makes it possible to obtain a secondary effect of improving the heat radiation characteristics of the semiconductor device.

Sixth Embodiment

Figure 7:
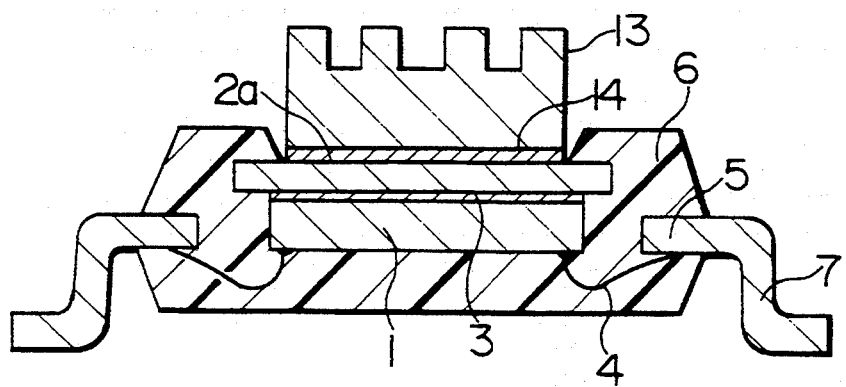
FIG. 7 is a side sectional view of a semiconductor device according a sixth embodiment of the present invention.

A semiconductor device according to a sixth embodiment of the present invention is shown in a side sectional view in FIG. 7. As shown in FIG. 7, this embodiment is distinguished in that the exposed surface 2b on the mounting pad 2 is directed upward (as viewed in the drawing) to constitute an upper exposed surface of the semiconductor device, and the outer leads 7 are accordingly formed. Further, a heat radiation member 13 is secured to the exposed surface 2b by an adhesive 14. The provision of the heat radiation member 13 enables further improvement in the heat radiation characteristics of the semiconductor device. When the adhesive 14 comprises an insulating adhesive, it is possible to obtain an insulating effect similar to that obtained in the third embodiment shown in FIG. 4. This effect can be obtained also when an insulator coats the heat radiation member 13. The heat radiation member 13 may be formed integrally with the mounting pad 2.

Seventh Embodiment

Figure 8:
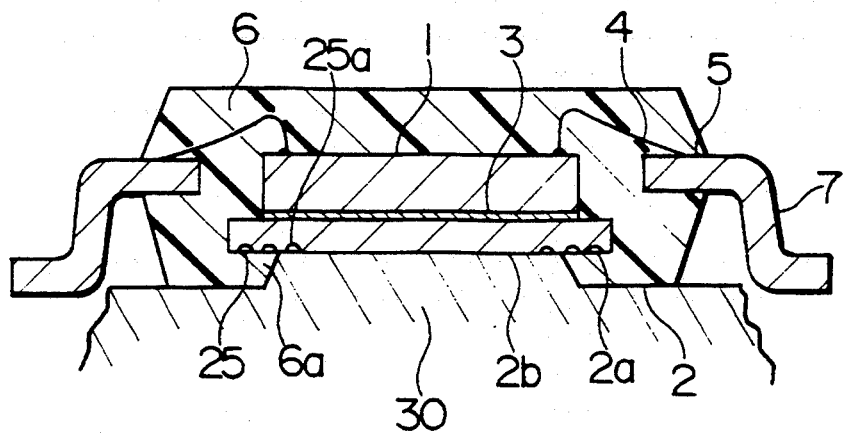
FIG. 8 is a side sectional view of a semiconductor device according to a seventh embodiment of the present invention.
Figure 9:
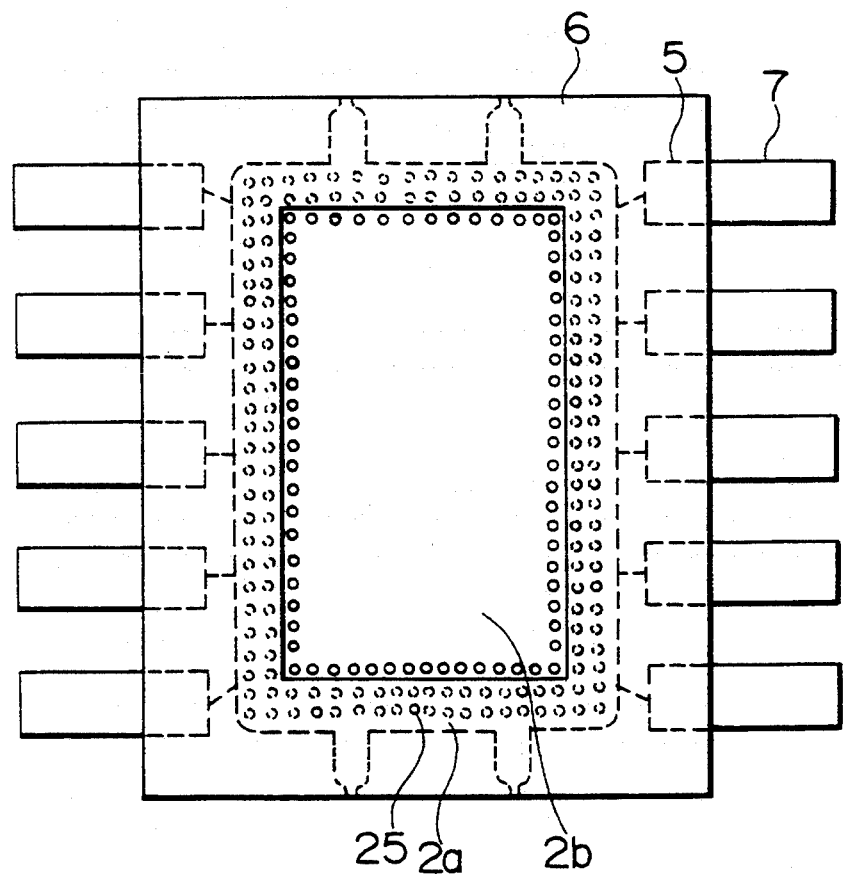
FIG. 9 is a plan view of the device shown in FIG. 8, taken from the reverse side of the device.
Figure 10:
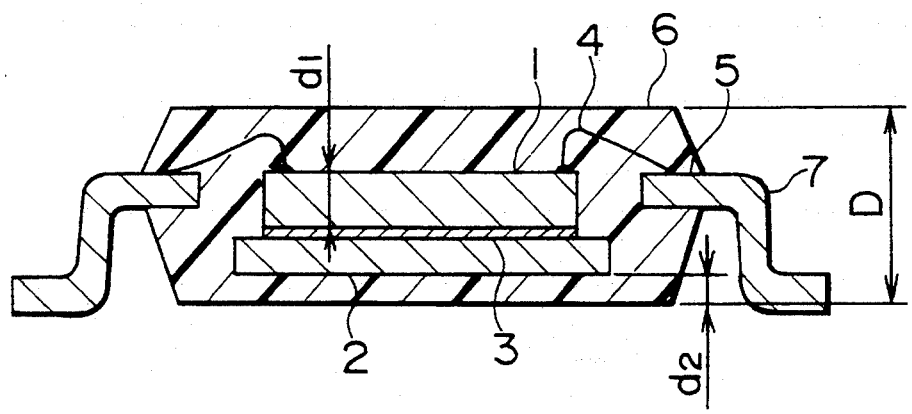
FIG. 10 is a side sectional view of a conventional semiconductor device.

A semiconductor device according to a seventh embodiment of the present invention is shown in FIG. 8 and FIG. 9, which are a side sectional view and a plan view taken from the reverse side of the device, respectively. Referring to these drawings, this embodiment is distinguished in that dimples 25 for preventing flow of the molding material 6 are formed on the second surface of the mounting pad 2. Specifically, the flow prevention dimples 25 are formed on a first location of the second surface which is included in the edge 2a of the mounting pad 2 molded in a frame-shaped configuration with a portion 6a of the molding material 6, and a second location of the second surface which is adjacent to but not covered with that portion 6a of the molding material 6 forming the frame-shaped configuration. The second surface of the mounting pad 2 includes a central portion on which no molding material 6 is disposed and which constitutes the exposed surface 2b of the device. The formation of the dimples 25 is advantageous in that even when the molding material 6, which is being molded in a mold 30, flows inward from a position at which the portion 6a of the material 6 should be formed, the inward flow of the molding material 6 is stopped by the dimples 25, thereby enabling the molding material 6 to be formed with high precision. No flow prevention dimples 25 are present on the central portion of the second surface of the mounting pad 2 to assure sufficient heat radiation characteristics.

As has been described above, a semiconductor device is constructed to provide the following advantages: concentration of stress on an edge portion of the mounting pad is reduced, thereby achieving high reliability; no molding material is disposed on the exposed portion of the reverse surface of the mounting pad on which the semiconductor element is not mounted, thereby facilitating molding; and the molding material can have a very small thickness, thereby improving the molding characteristics of the molding material. Further, when the semiconductor element is secured to the mounting pad with an insulating adhesive, it is possible to provide an arrangement for insulating the semiconductor element without requiring a separate process. When a radiation member is provided on an exposed surface formed by a portion of the reverse surface of the mounting pad, it is possible to improve the heat radiation characteristics of the semiconductor device. When flow prevention dimples are formed on the reverse surface of the mounting pad at a first location included in an edge of the mounting pad molded in a frame-shaped configuration with a portion of the molding material and a second location adjacent to the first location and not covered by the molding material, it is possible to cover the edge of the mounting pad with a portion of the molding material in such a manner that the molding material is prevented from flowing toward the center of the reverse surface of the mounting pad.

What is claimed is:

1. A resin-packaged semiconductor device comprising:
   a semiconductor element having opposed first and second surfaces;
   a mounting pad having a first surface on which the second surface of said semiconductor element is mounted;
   inner leads extending across part of and spaced from the first surface of said semiconductor element and electrically connected to said semiconductor element;
   conduction means electrically connecting said semiconductor element and said inner leads to each other;
   a molding material encapsulating said semiconductor element, said mounting pad, said inner leads, and said conduction means; and
   outer leads continuing from said inner leads and extending outside of said molding material wherein said mounting pad has an edge encapsulated in a frame-shaped portion of said molding material, and wherein a second surface of said mounting pad opposite the first surface has a central portion not part of said edge of said mounting pad and not covered by said molding material, said central portion of said second surface being exposed as an outside surface of said device, said mounting pad having flow prevention dimples on said second surfacer said flow prevention dimples being located at first and second locations of said second surface, said first location being included in said edge of said mounting pad covered by said frame-shaped portion of said molding material and said second location being adjacent to said first location and not covered by said molding material.

2. The resin-packaged semiconductor device according to claim 1 comprising an insulator disposed on said central portion of said second surface of said mounting pad.

3. The resin-packaged semiconductor device according to claim 1 wherein said semiconductor element is secured to said mounting pad by an electrically insulating adhesive.

4. The resin-packaged semiconductor device according to claim 1 comprising a heat radiation member disposed on said central portion of said second surface of said mounting pad.

5. The resin-packaged semiconductor device according to claim 1 comprising a heating radiating member mounted on the second surface of said mounting pad.

* * * * *

UNITED STATES PATENT AND TRADEMARK OFFICE
CERTIFICATE OF CORRECTION

PATENT NO. : 5,440,169
DATED : August 8, 1995
INVENTOR(S) : Tomita et al.

It is certified that error appears in the above-indentified patent and that said Letters Patent is hereby corrected as shown below:

Column 6, Line 47, change "surfacer" to --surface,--

Line 66, change "heating" to --heat--.

Signed and Sealed this

Ninth Day of January, 1996

Attest:

BRUCE LEHMAN

Attesting Officer    Commissioner of Patents and Trademarks